United States Patent
Moritani et al.

[11] Patent Number: 5,833,749
[45] Date of Patent: Nov. 10, 1998

[54] COMPOUND SEMICONDUCTOR SUBSTRATE AND PROCESS OF PRODUCING SAME

[75] Inventors: Akihiro Moritani; Aiji Yabe; Akiyoshi Tachikawa; Takashi Aigo, all of Kawasaki, Japan

[73] Assignee: Nippon Steel Corporation, Tokyo, Japan

[21] Appl. No.: 585,505

[22] Filed: Jan. 16, 1996

[30] Foreign Application Priority Data

Jan. 19, 1995 [JP] Japan ................................ 7-024617

[51] Int. Cl.$^6$ .................................................. C30B 25/18
[52] U.S. Cl. ...................... 117/101; 117/902; 438/293; 438/292
[58] Field of Search .................... 117/101, 902; 437/132, 133; 438/293, 292

[56] References Cited

U.S. PATENT DOCUMENTS

| T951,008 | 10/1976 | Regh | 117/902 |
|---|---|---|---|
| 4,120,706 | 10/1978 | Mason | 117/101 |
| 4,707,216 | 11/1987 | Morkoc et al. | 117/902 |
| 4,963,508 | 10/1990 | Umeno et al. | 117/902 |
| 4,965,224 | 10/1990 | Horikawa et al. | 117/101 |
| 5,289,721 | 3/1994 | Tanizawa et al. | 73/727 |
| 5,394,826 | 3/1995 | Ebe et al. | 117/101 |

FOREIGN PATENT DOCUMENTS

| 61-26216 | 2/1986 | Japan . |
|---|---|---|
| 61-70715 | 4/1986 | Japan . |
| 62-58614 | 3/1987 | Japan . |
| 62-58690 | 3/1987 | Japan . |
| 5-166724 | 7/1993 | Japan . |
| 6-54761 | 7/1994 | Japan . |
| 6-244122 | 9/1994 | Japan . |

OTHER PUBLICATIONS

Ohori et al., "HEMT on Silicon Substrate", Oyobutsuri (Applied Physics), vol. 64, No. 2 (1995), pp. 119–125. (Japanese Publication with Partial Translation).
Fujita et al., "Effects of Pre–Growth . . . ", Sumitomo Metals, vol. 43–4 (1991) pp. 26–36. (Japanese Publication with Partial Translation).
Fujita et al., "AsH3 Preflow Effects . . . ", Appl. Phys. Lett., 59(26), 23 Dec. 1991, pp. 3458–3460.
Ohkubo et al., "New MOCVD Growth . . . ", Paper Presented at Int. Symp. GaAs and Related Compounds, Karuizawa, 1992, pp. 187–192.

Primary Examiner—Robert Kunemund
Attorney, Agent, or Firm—Pollock, Vande Sande & Priddy

[57] ABSTRACT

A compound semiconductor substrate having at least one compound semiconductor layer epitaxially grown on a silicon single crystal substrate, wherein the silicon single crystal substrate has a surface on which the compound semiconductor layer is epitaxially grown, the surface being inclined at an off angle of not more than 1 deg to a (100) plane of silicon crystal; and the compound semiconductor layer has a free or top surface having a roughness of 3 nm or less in terms of a mean square roughness, Rms, determined by an atomic force microscopic measurement in a view field area of 10 $\mu$m×10 $\mu$m or a roughness of 10.5 nm or less in terms of a maximum height difference, Ry.

The compound semiconductor substrate is produced by a process comprising the steps of: preparing a silicon single crystal substrate having a surface inclined at an off angle of not more than 1 deg to a (100) plane of silicon crystal; forming a buffer layer of a first compound semiconductor layer having a thickness of 5 nm to 15 nm on the surface of the silicon single crystal substrate; and epitaxially growing a second compound semiconductor layer on the buffer layer.

8 Claims, 6 Drawing Sheets

<011̄> DIRECTION

OFF ANGLE 0.1-1°

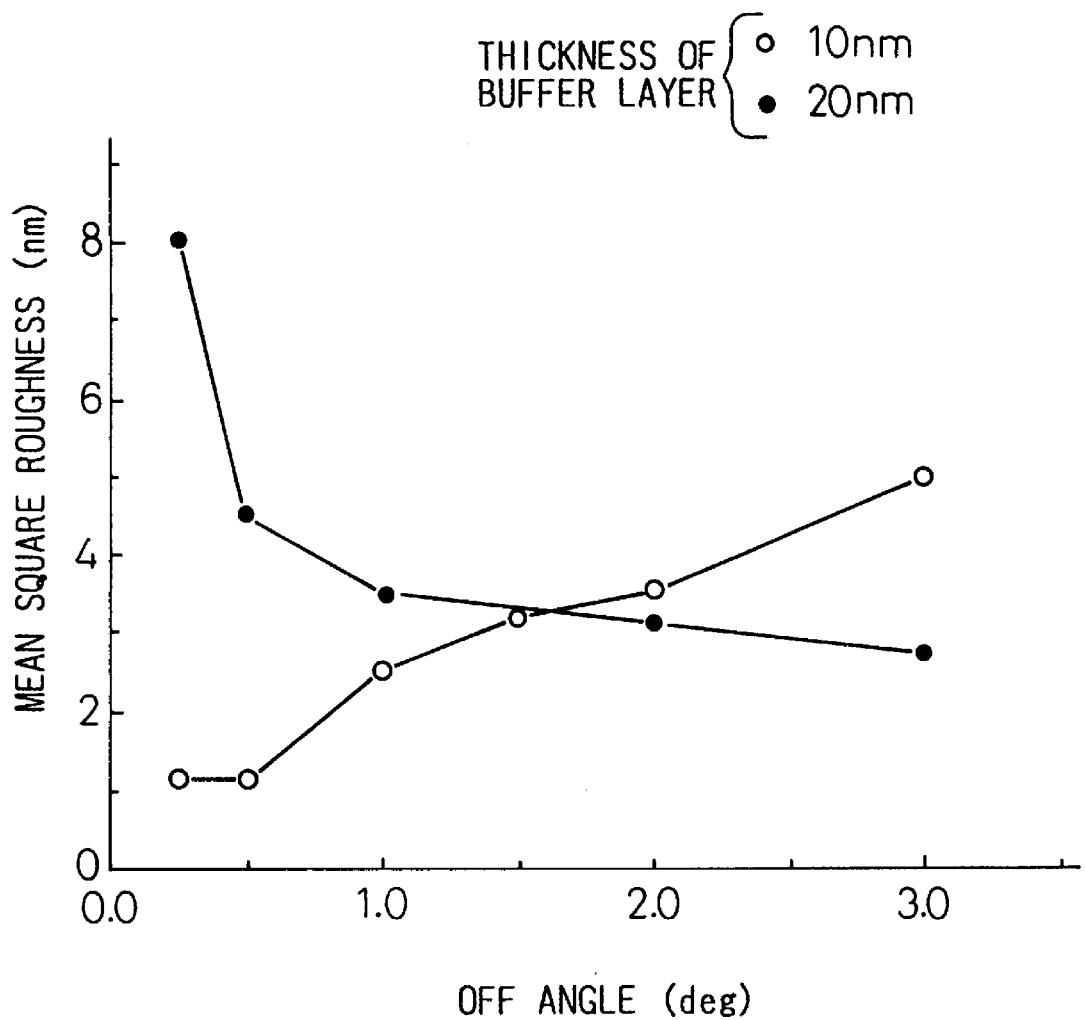

COMPOUND SEMICONDUCTOR SUBSTRATE AND PROCESS OF PRODUCING SAME

BACKGROUND OF THE INVENTION

1. Field of the Invention

The present invention relates to a compound semiconductor substrate, particularly to a compound semiconductor substrate having at least one compound semiconductor layer epitaxially grown on a silicon single crystal substrate, and a process of producing same.

The present invention also relates to a semiconductor device fabricated on a compound semiconductor substrate and a process of producing same.

2. Description of the Related Art

Currently producible compound semiconductor substrates composed of a compound semiconductor have a maximum diameter of 3 to 4 inches.

In contrast, another type of compound semiconductor substrates composed of a compound semiconductor layer, such as GaAs, epitaxially grown on a silicon substrate, referred to as a GaAs/Si substrate, are producible with a greater diameter, such as 8 inches, 12 inches, etc., and therefore, are desirable as a substrate to fabricate compound semiconductor devices thereon.

GaAs/Si substrates are conventionally produced by a two-step growth process in which a GaAs compound semiconductor layer is formed on a silicon single crystal substrate having a surface inclined at an off angle of from 2 to 5 deg in the <011> direction to the (100) plane of silicon crystal, as disclosed in Japanese Unexamined Patent Publication (Kokai) Nos. 61-26216 and 61-70715.

The two-step growth process includes cleaning a silicon substrate surface having the above-mentioned off angle, heat-treating the substrate in a growth chamber for compound semiconductors at a temperature of 800° C. or more under a hydrogen atmosphere to completely remove a natural oxide film from the substrate surface, lowering the temperature prevailing in the growth chamber to about 450° C., introducing into the chamber a source gas for a compound semiconductor to be grown, thereby growing a 20 to 200 nm thick, amorphous compound semiconductor layer on the substrate surface. The temperature in the growth chamber is then raised to an epitaxial growth temperature of from 650° C. to 700° C., in which the amorphous semiconductor is crystallized to form a buffer layer during the rise of the temperature. At the epitaxial growth temperature, a compound semiconductor is grown epitaxially on the buffer layer to complete a compound semiconductor substrate to be used for fabricating electronic device elements thereon.

Japanese Unexamined Patent Publication (Kokai) No. 6-244122 discloses a growth-during-temperature rise process, in which a buffer layer is grown while the temperature is raised from a lower temperature to the usual epitaxial growth temperature, thereby epitaxially growing on a silicon substrate a compound semiconductor layer having a specular top surface.

The compound semiconductor substrates produced by the above-recited processes, however, were unsuitable for fabricating electronic device elements because the substrates had a surface smoothness of 15 nm to 20 nm, or more, in terms of a maximum height difference determined by an atomic force microscope (AFM).

Japanese Unexamined Patent Publication (Kokai) No. 5-166724 and Oyo Butsuri (Applied Physics), vol. 64, No. 2, pages 119 to 125 disclose a process in which a buffer layer is polished to provide an improved smoothness and an epitaxial growth is then performed on the smoothed buffer layer, thereby forming a compound semiconductor substrate having a surface smoothness of 2 to 3 nm in terms of a maximum height difference suitable for fabricating electronic device elements thereon.

Japanese Unexamined Patent Publication (Kokai) Nos. 62-58614 and 62-58690 and Japanese Examined Patent Publication (Kokoku) No. 6-54761 proposed a process which does not use temperatures lower than the usual growth temperature for compound semiconductors used in the two-step growth process or the growth-during-temperature rise process, but which grows a 50 nm thick intermediate layer on a silicon substrate at a usual growth temperature for the growth of compound semiconductors and then epitaxially grows a compound semiconductor on the intermediate layer. The publications also disclose that a compound semiconductor having a specular surface is obtained with an off angle of 0.5 to 5 deg or greater and that the off angle is preferably from 1 to 3 deg.

However, the compound semiconductors disclosed in these publications could not provide a surface smoothness sufficient to fabricate electronic device elements thereon, particularly when the off angle is not more than 1 deg.

The above-recited conventional processes have the following problems.

In the two-step growth process, it is known that the initially grown amorphous layer has a thickness of 200 nm at most, causing a distribution of discrete crystal islands to form during the crystallization in the process of raising temperature and fails to form a buffer layer continuously covering the silicon substrate surface (See Sumitomo Metals Technical Report, vol. 43, No. 4, pages 26 to 36 and Applied Physics Letter 59(26), 23 Dec. 1991, p. 3458). It is believed that the compound semiconductor substrate had a rough surface with a maximum height difference of 15 to 20 nm or more, because a compound semiconductor was epitaxially grown on an uneven substrate having such a distribution of discrete crystal islands. The growth-during-temperature rise process could halve this maximum height difference, but cannot completely solve the problem because it has the same drawback.

The surface smoothness was first precisely determined by utilizing AFM, which became available for practical use only in recent years. Thus, the surface smoothness has not yet been well evaluated for various semiconductor substrates until now.

It is also known that semiconductor substrates to be used for LSI production should preferably have a surface roughness of 3 nm or less in terms of a mean square roughness, Rms, as reported in "GaAs and Related Compound", Karuizawa Inst. Phys. Ser. No. 129, 1992, Chapter 3, p. 187.

Thus, the compound semiconductor substrates produced by the two-step growth process had a problem that the surface smoothness is not sufficient for practical use and electronic device elements or LSI, if fabricated on the substrate, could not provide a good electronic characteristics and product yield.

The above-recited Japanese Unexamined Patent Publication (Kokai) No. 5-166724 discloses that a precise AFM observation in a 2000 nm square area has shown an extreme difficulty for the conventional two-step growth process to prevent the occurrence of a roughness of about 10 to 20 nm and that good smoothness can only be obtained by a polishing and regrowth process. This process, however, causes a serious problem in productivity and cost because it is necessary that the growth process is interrupted and that the substrate is removed from the growth chamber, polished, and returned to the growth chamber.

SUMMARY OF THE INVENTION

An object of the present invention is to provide a compound semiconductor substrate having at least one compound semiconductor layer epitaxially grown on a silicon single crystal substrate and having a surface smoothness sufficient to fabricate semiconductor devices having good electronic characteristics without the need for polishing with an interruption of the growth process, and to provide a process of producing the compound semiconductor substrate.

Another object of the present invention is to provide a semiconductor device fabricated on the compound semiconductor substrate and a process of fabricating a semiconductor device on the substrate.

To achieve the object according to the present invention, there is provided a compound semiconductor substrate having at least one compound semiconductor layer epitaxially grown on a silicon single crystal substrate, wherein:

the silicon single crystal substrate has a surface on which the compound semiconductor layer is epitaxially grown, the surface being inclined at an off angle of not more than 1 deg to a (100) plane of silicon crystal; and the compound semiconductor layer has a free or top surface having a roughness of 3 nm or less in terms of a mean square roughness, Rms, determined by an atomic force microscopic measurement in a view field area of 10 $\mu$m×10 $\mu$m.

The specified roughness in terms of the mean square roughness, Rms, corresponds to a roughness of 10.5 nm or less in terms of a maximum height difference, Ry.

More preferably, the off angle is less than 0.5 deg to provide a further reduced surface roughness of less than 2 nm in terms of Rms or less than 10 nm in terms of Ry.

Although the off angle is most preferably zero deg, a controllable lower limit of the off angle is generally 0.1 deg when considering the precision of polishing a silicon single crystal substrate and of setting the polished substrate in a growth chamber.

The compound semiconductor may be any one suitable to fabricate semiconductor devices thereon and may be any one selected from III–V or II–VI compound semiconductors. The III–V compound semiconductors include GaAs, GaP, AlAs, AlP, InAs, InP, GaAsP, AlAsP, InAsP, AlGeAs, AlInAs, GaInAs, AlGaP, AlInP, and GaInP, for example. The II–VI compound semiconductors include ZnS, ZnSe, ZnTe, CdS, CdSe, CdTe, HgTe, CdZbS, SdZnSe, CdZnTe, ZnSSe, CdSSe, ZnSeTe, CdSeTe, and HgCdTe, for example.

According to the present invention, there is also provided a process of producing a compound semiconductor substrate having at least one compound semiconductor layer epitaxially grown on a silicon single crystal substrate, comprising the steps of:

preparing a silicon single crystal substrate having a surface inclined at an off angle of not more than 1 deg to a (100) plane of silicon crystal;

forming a buffer layer of a first compound semiconductor layer having a thickness of 5 nm to 15 nm on the surface of the silicon single crystal substrate; and epitaxially growing a second compound semiconductor layer on the buffer layer.

The step of forming the buffer layer may comprise forming an amorphous layer on the surface of the silicon single crystal substrate and crystallizing the amorphous layer to form the buffer layer.

The present invention also provides a semiconductor device fabricated on a compound semiconductor substrate according to the present invention and provides a process of fabricating a semiconductor device on a compound semiconductor substrate according to the present invention.

BRIEF DESCRIPTION OF THE DRAWINGS

FIG. 2 is a graph showing the relationship between the off angle and the surface roughness in terms of the mean square roughness, Rms, for samples having inventive and conventional buffer layer thicknesses, respectively;

DESCRIPTION OF THE PREFERRED EMBODIMENTS

According to the present invention, the surface of a silicon single crystal substrate on which a compound semiconductor layer is grown has an off angle of not more than 1 deg, so that the surface has a reduced number of steps at the atomic scale or at the crystal lattice scale over a unit length, thereby providing an extremely improved surface smoothness of a compound semiconductor layer grown on the surface.

An actual silicon single crystal substrate has a stepwise surface in atomic scale, because the surface does not strictly coincide with a crystal plane, such as a (100) plane, but is inclined at a small angle (off angle) to the latter.

When an epitaxial growth occurs on the substrate surface, edges of the steps provide sites for preferential nucleation and cause protrusions to form thereat.

In the present invention, the off angle is not more than 1 deg which is smaller than the conventional off angle, so that the substrate surface has a reduced number of atomic scale steps, and thus, a reduced number of protrusions forming at the step edges, thereby providing an improved surface smoothness of a compound semiconductor layer grown on the substrate.

In addition to the feature that the off angle is not more than 1 deg which is smaller than the conventional off angle, the process of producing a compound semiconductor substrate according to the present invention uses a compound semiconductor buffer layer grown on the surface, that has a reduced thickness of 5 nm to 15 nm in comparison with the conventional buffer layer, and thereby minimizes the amount of crystal islands and provides an improved surface smoothness of a compound semiconductor layer grown on the substrate.

If the buffer layer has a conventional large thickness with a reduced off angle of not more than 1 deg, the buffer layer provides a larger amount of the material per step edge to form a crystal island during the temperature rise for crystallization than for the conventional large off angle of 2 to 5 deg, so that larger crystal islands grow from the step edges providing nucleation sites. To prevent this, the absolute amount of the buffer layer must be reduced, i.e., the buffer layer must have a smaller thickness of 5 nm to 15 nm than in the conventional process.

In the semiconductor device and process of producing the same according to the present invention, the semiconductor device is fabricated on the compound semiconductor substrate having an extremely improved surface smoothness sufficient to enable electronic device elements having no fluctuation in the operating performance to be produced with a good yield.

The present invention will now be described in further detail with reference to the attached drawings.

EXAMPLE 1

Figure 1A:
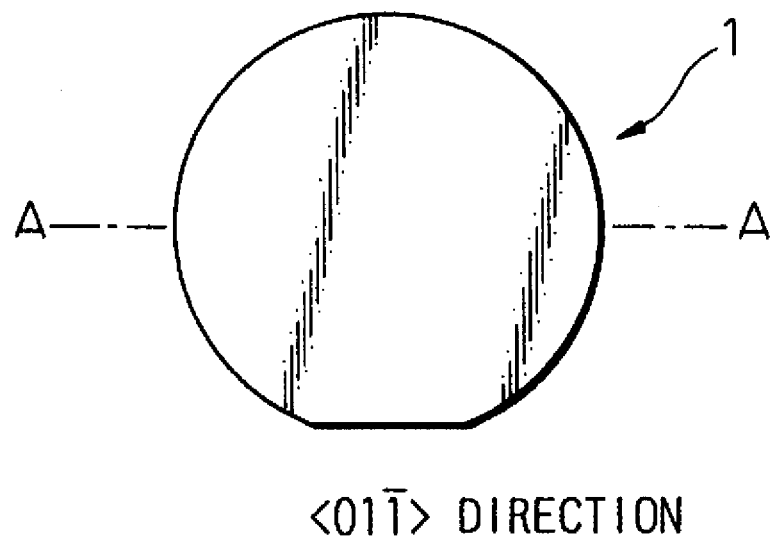
FIGS. 1(a) and 1(b) are plan and cross-sectional views schematically illustrating a compound semiconductor substrate according to the present invention.
Figure 1B:
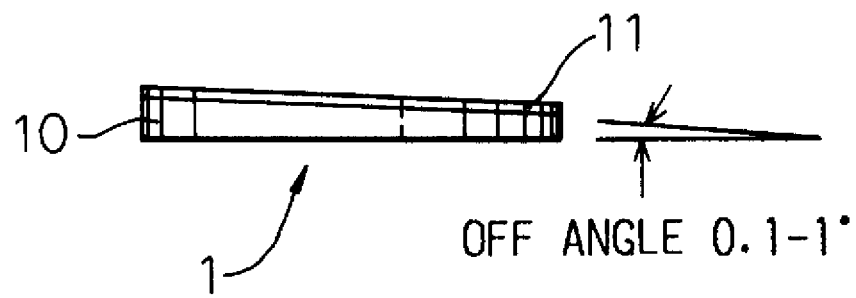

FIGS. 1(a) and 1(b) schematically illustrate a compound semiconductor substrate produced by epitaxially growing a GaAs layer on a 3-inch silicon single crystal substrate in (a) a plan view and (b) a cross-sectional view along the line A—A of FIG. 1(a), respectively.

The semiconductor substrate 1 shown in FIGS. 1(a) and 1(b) is composed of a silicon substrate 10 having a surface inclined at an off angle of not more than 1 deg to the (100) plane of silicon crystal in the <011> direction and a GaAs layer 11 epitaxially grown on the silicon substrate 11 to a thickness of about 3 $\mu$m. The semiconductor substrate 1 (hereinafter referred to as a "GaAs/Si substrate") was produced by the following process.

Three silicon substrates having off angles of 0.25, 0.5, and 1.0 deg within the present inventive range were prepared. The silicon substrates were cleaned with fluoric acid, pure water, etc., and each was processed in the following sequence.

The silicon substrate was placed in an MOCVD epitaxial growth chamber and was heat-treated at 850° C. for 5 minutes in an atmosphere of hydrogen containing 0.5 vol % or less of arsenic to remove a natural surface oxide film.

Then, after the substrate temperature was lowered to about 400° C., trimethylgallium and arsine gases were introduced as source materials in the chamber to cause an amorphous GaAs layer to grow on the substrate 1 to a thickness of 10 nm.

Then, after the introduction of the trimethylgallium gas was interrupted, the substrate temperature was raised to about 650° C. in about 5 minutes to crystallize the amorphous GaAs layer to form a single crystal GaAs buffer layer.

The introduction of the trimethylgallium gas was then restarted to cause a GaAs layer to epitaxially grow to a thickness of about 3 $\mu$m on the single crystal GaAs buffer layer to complete a GaAs/Si substrate.

COMPARATIVE EXAMPLE 1

Silicon substrates having off angles of 1.5, 2.0 and 3.0 deg, which were outside the present inventive range, were also subjected to the same process as in Example 1 to produce GaAs/Si substrates.

COMPARATIVE EXAMPLE 2

Silicon substrates having off angles of 0.25, 0.5 and 1.0 deg, which were within the present inventive range, and silicon substrates having off angles of 2.0 and 3.0 deg, which were outside the present inventive range, were subjected to the same process as in Example 1, except that the buffer layer had a thickness of 20 nm outside the present inventive range, to produce GaAs/Si substrates.

To evaluate the surface smoothness for the GaAs/Si substrates produced in Example 1 and Comparative Examples 1 and 2, the mean square roughness Rms was determined by AFM observation (NANOSCOPE, Digital Instruments Inc.). The value "Rms" is defined as a square root of an arithmetic mean of the deviations of values on a measured curve from a mean line. An area of 10 $\mu$m×10 $\mu$m was subjected to the AFM observation. The results are summarized in FIG. 2 and Table 1.

TABLE 1

| Thickness of Buffer Layer | Surface Roughness of GaAs Layer: Mean Square Roughness Rms in nm. | | | | | |
|---|---|---|---|---|---|---|
| | Off Angle (deg) | | | | | |
| (nm) | 0.25 | 0.5 | 1.0 | 1.5 | 2.0 | 3.0 |
| 10 | 1.14 | 1.14 | 2.52 | 3.19 | 3.54 | 5.01 |
| 20 | 8.00 | 4.50 | 3.50 | — | 3.12 | 2.70 |

In FIG. 2, the blank plots show the surface roughness values obtained under a present inventive buffer layer thickness of 10 nm and the solid plots show the surface roughness values obtained using a conventional buffer layer thickness of 20 nm.

It can be seen from FIG. 2 or Table 1 that, when the silicon substrate had an off angle of not more than 1 deg and the buffer layer was 10 nm thick according to the present invention, the mean square roughness Rms ranged from 1.14 to 2.52 nm and the Rms values of not more than 3 nm were stably provided. When the silicon substrate had an off angle of 2 deg or more and the buffer layer was 20 nm thick, which are outside the present inventive range, the mean square roughness Rms ranged from 2.70 to 3.12 and Rms values of not more than 3 nm were not stably provided.

The surface roughness of the same GaAs/Si substrates was also determined in terms of the maximum height difference Ry. The measurement was carried out by a contact profile meter according to JIS B0601 (1994) with a reference length of 0.025 mm and a measurement length of 0.125 mm. The results are summarized in FIGS. 3(a) and 3(b) and Table 2. The blank plots (FIG. 3(a)) and the solid plots (FIG. 3(b)) show the surface roughness values obtained using buffer layer thicknesses of 10 nm (present invention) and 20 nm (conventional), respectively.

TABLE 2

| Thickness of Buffer Layer | Surface Roughness of GaAs Layer: Maximum Height Difference Ry in nm. | | | | |
|---|---|---|---|---|---|
| | Angle (deg) | | | | |
| (nm) | 0.25 | 0.5 | 1.0 | 2.0 | 3.0 |
| 10 | 8.1 | 9.6 | 10.2 | 11.6 | 14.3 |
| 20 | 14.7 | 13.2 | 11.5 | 10.6 | 10.3 |

Figure 3A:
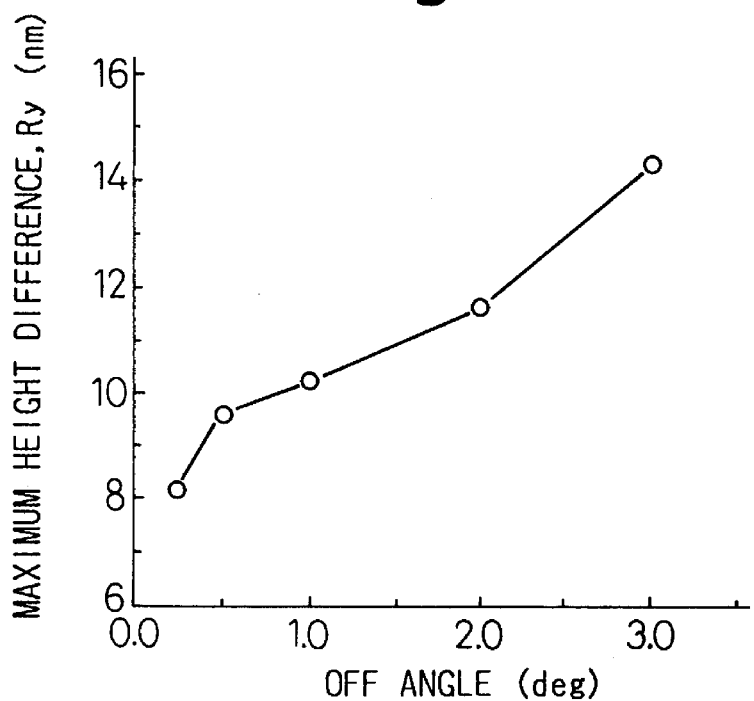
FIGS. 3(a) and 3(b) are graphs showing the relationship between the off angle and the surface roughness in terms of the maximum height difference, Ry, for samples having inventive and conventional buffer layer thicknesses, respectively.
Figure 3B:
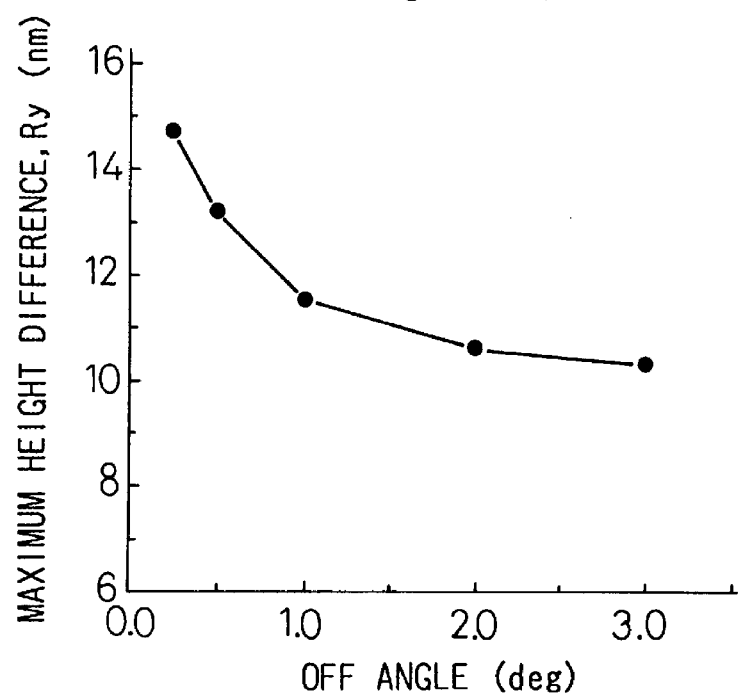

It can be seen from FIGS. 3(a) and 3(b) and Table 2 that, when the silicon substrate had an off angle of not more than 1 deg and the buffer layer was 10 nm thick according to the present invention, the maximum height difference Ry ranged from 8.1 to 10.2 nm and the Ry values of not more than 10.5 nm were stably provided. When the silicon substrate had an off angle of 2 deg or more and the buffer layer was 20 nm thick outside the present inventive range, the maximum height difference Ry ranged from 10.3 to 10.6 and Ry values of not more than 10.5 nm were not stably provided.

Thus, two measurement systems used for evaluating the surface roughness according to the present invention have an interrelationship such that the upper limit of 3 nm in terms of the Rms value determined by the AFM measurement corresponds to the upper limit of 10.5 in terms of the Ry value determined by the contact profile meter measurement.

It should also be noted that, when the buffer layer had a conventional large thickness, the surface roughness decreases as the off angle increases whereas, when the buffer layer had a present inventive small thickness, the surface roughness increases as the off angle increases. The inverse tendencies are thought to occur for the following reasons.

When a silicon substrate has a conventional large off angle, the atomic scale steps are also present in a large number such that the buffer layer must have a large thickness in order to provide a sufficient amount of material to completely cover all the steps. When a silicon substrate has a present inventive small off angle, the amount of material is lacking and steps uncovered by the buffer layer are left. At the steps not covered by the buffer layer, a compound semiconductor grows at a reduced rate and/or an anti-phase boundary forms with the result that the thus-produced compound semiconductor substrate has a rough surface.

The current polishing technique has an error of about 0.1 deg in controlling the off angle of a silicon substrate. In Example 1, for example, an X-ray analysis showed that the silicon substrate having an off angle of 0.25 deg was also inclined to the (100) plane in a direction other than the <011> direction. Thus, the direction of the off angle is not limited to the <011> direction but may be other directions so long as it is within the specified range, in order to provide the improved surface smoothness according to the present invention.

To provide a good surface smoothness of a compound semiconductor substrate according to the present invention at an improved reproducibility, the off angle is preferably in the <011> or equivalent directions.

When an off angle of zero deg is used, an inclination of about 0.1 deg or more occurs in plural or uncontrollable directions, because the current polishing technique has an error of about 0.1 deg as described above. If an epitaxial growth occurs on such a silicon substrate, the orientation of the crystal growth is so unstable that a GaAs single crystal is hard to grow and twin boundaries form. To eliminate this problem, the off angle is preferably not less than 0.1 deg.

Figure 4A:
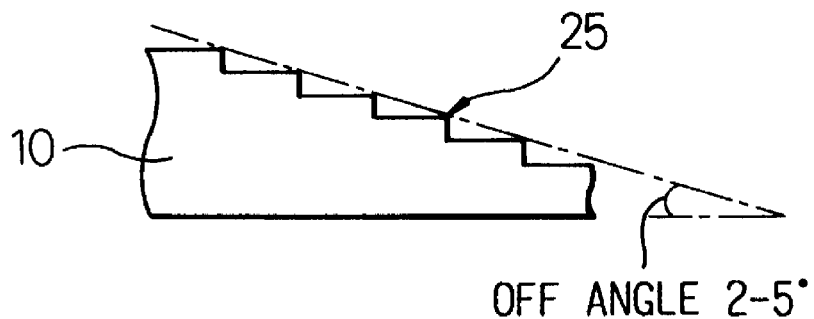
FIGS. 4(a) and 4(b) are cross-sectional views schematically illustrating the atomic scale surface steps of samples having conventional and inventive off angles, respectively.

Referring to the schematic illustrations of FIGS. 4(a) and 4(b), the mechanism of improving the surface roughness according to the present invention will be described. FIG. 4(a) shows a conventional off angle of from 2 to 5 deg and FIG. 4(b) shows a present inventive off angle of not more than 1 deg, and preferably not less than 0.1 deg.

When a silicon substrate 10 has an off angle, the substrate surface has atomic scale steps as shown. The step edges 25 act as a growth nucleus, i.e., the growth starts at the step edges 25 and proceeds two- or three-dimensionally to the final top surface of an epitaxial layer, thereby causing formation of protrusions in the surface.

Figure 4B:
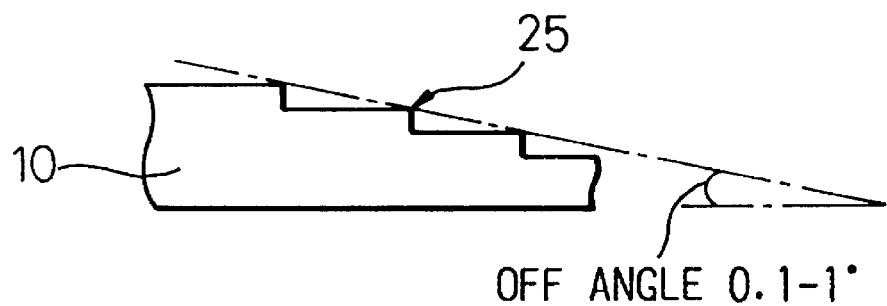

In comparison with the conventional large off angle as shown in FIG. 4(a), the present invention uses the small off angle as shown in FIG. 4(b) to reduce the number of atomic steps per unit length and also to reduce the number of the step edges 25, with the result that the final epitaxial layer has a reduced number of the surface protrusions, i.e., an improved surface smoothness.

In the present invention, the buffer layer also has a reduced thickness, within the specified range, in comparison with the conventional buffer layer, so that the number of the surface protrusions is further reduced to provide a further improved surface smoothness.

Figure 5:
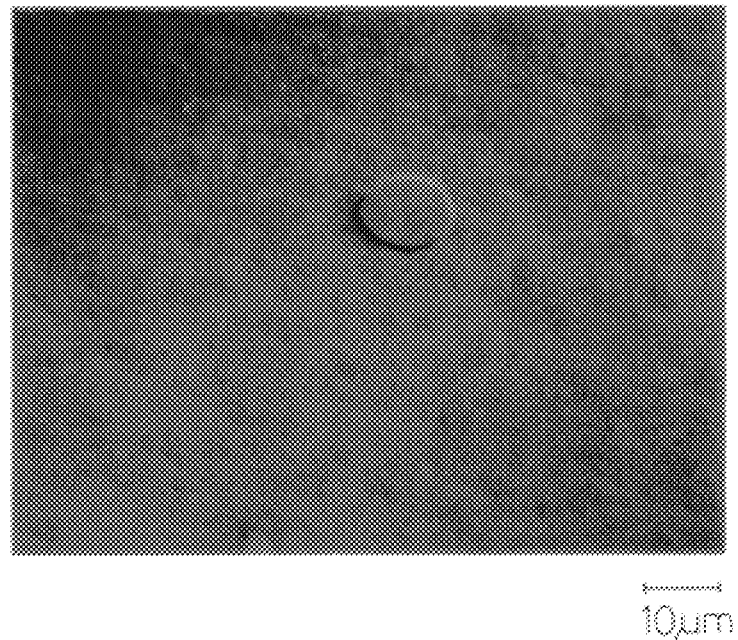
FIG. 5 is a photomicrograph of the top surface of a conventional compound semiconductor substrate, showing an abnormal growth portion occurred under the inventive off angle and the conventional buffer layer thickness.

Another factor for determining the surface smoothness of an epitaxial compound semiconductor layer is an abnormal growth portion. FIG. 5 is an optical microphotograph (magnification: 1000) of the top surface of an epitaxial GaAs layer grown in Comparative Example 2 using a silicon substrate having a present inventive off angle of 0.5 deg and the same process conditions and sequence as in Example 1 except that the buffer layer had a conventional large thickness of 20 nm.

FIG. 5 shows an elliptical area in the central portion thereof. The elliptical area is an abnormal growth portion grown from an abnormal growth nucleus caused by the fact that the buffer layer was excessively thicker and outside the present inventive range. The abnormal growth occurred at a frequency of up to 1 per an area of 0.1 mm×0.1 mm and had a size of up to 0.01 mm. According to the present invention, the buffer layer has a reduced thickness within the specified range to prevent the abnormal growth from occurring.

EXAMPLE 2

A silicon substrate having a present inventive off angle of 0.5 deg was prepared. The silicon substrate was cleaned with fluoric acid, pure water, etc., then placed in an MOCVD epitaxial growth chamber, and heat-treated at 850° C. for 5 minutes in an atmosphere of hydrogen containing 0.5 vol % or less arsenic to remove a surface oxide film.

Then, after the substrate temperature was lowered to about 400° C., source material gases of trimethylgallium and arsine were introduced into the chamber while the substrate temperature was raised to 500° C. in 2 minutes to grow a 15 nm thick amorphous GaAs layer on the substrate 1.

Thereafter, after the introduction of the trimethylgallium gas was interrupted, the substrate temperature was raised to about 650° C. in about 5 minutes to crystallize the amorphous GaAs layer to form a single crystal GaAs buffer layer.

Then, the introduction of the trimethylgallium gas was restarted to epitaxially grow an about 3 $\mu$m thick GaAs layer on the single crystal GaAs buffer layer.

The surface smoothness of the thus-produced epitaxial GaAs layer was determined by the same methods as used in Example 1 yielding a mean square roughness Rms of 1.05 nm and a maximum height difference Ry of 7.6 nm.

EXAMPLE 3

Figure 6:
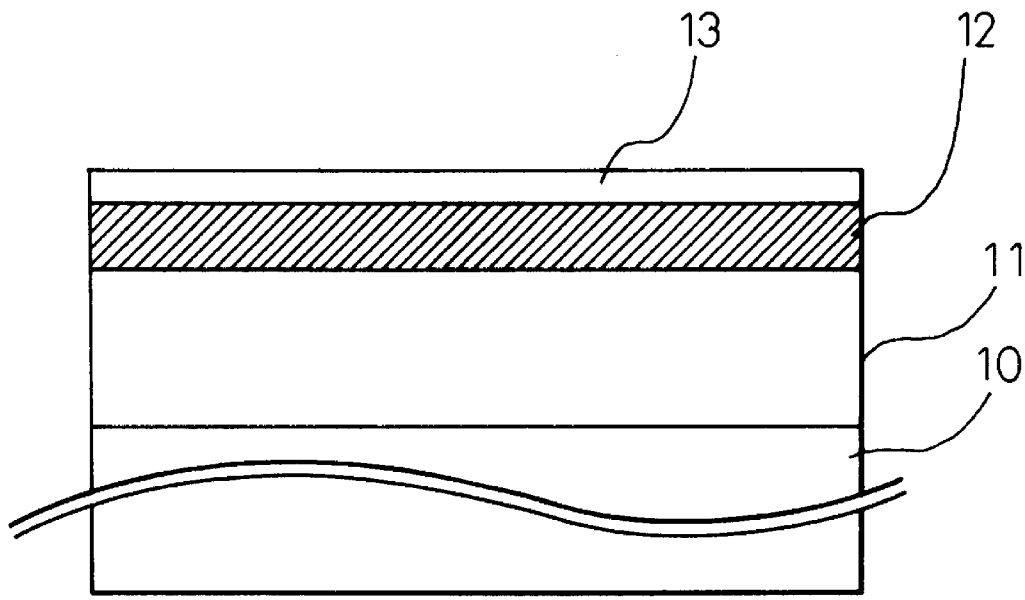
FIG. 6 is a cross-sectional view of a compound semiconductor substrate according to the present invention.
Figure 7:
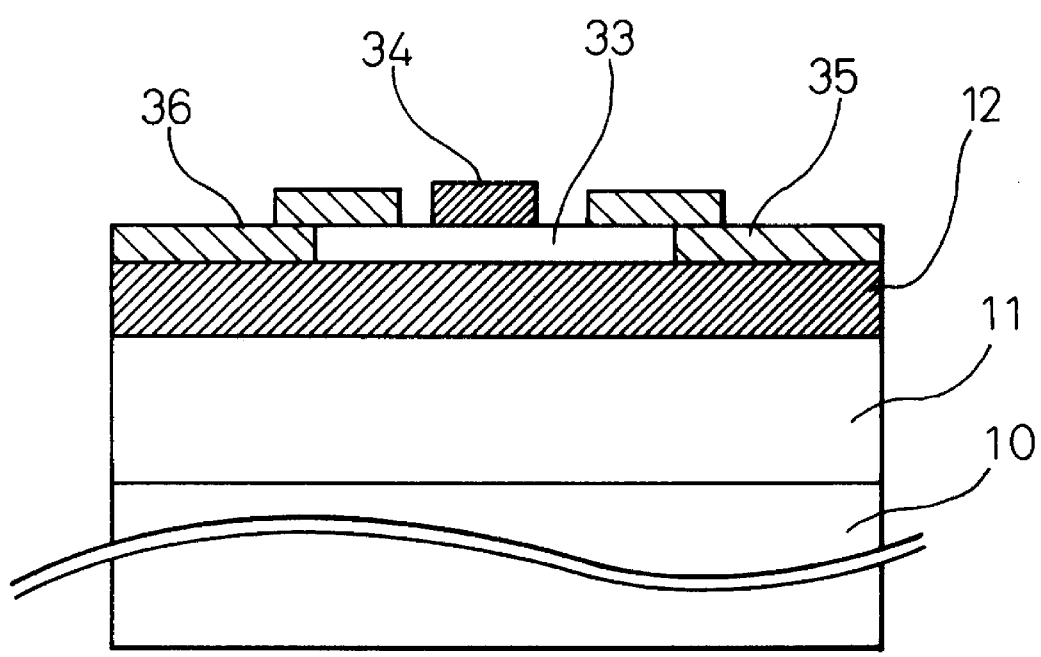
FIG. 7 is a cross-sectional view of a semiconductor device fabricated on the compound semiconductor substrate shown in FIG. 6.

A multiple layer structure shown in FIG. 6 was formed on the present inventive GaAs/Si substrate produced with an off angle of 0.5 deg in Example 1 and a semiconductor device shown in FIG. 7 was fabricated on the multiple layer structure.

The multiple layer structure of FIG. 6 was formed on a GaAs/Si substrate composed of a silicon substrate 10 having a 2 $\mu$m thick epitaxial GaAs layer 11 thereon, by epitaxially growing a 1 $\mu$m thick AlGaAs layer 12 on the layer 11 and growing on the layer 12 a 0.1 $\mu$m thick n-type GaAs layer 13 having an impurity concentration of $2.0 \times 10^{17}$ cm$^{-3}$ for forming the channel layer of an FET.

The semiconductor device shown in FIG. 7 is a GaAs MESFET having an n-type GaAs layer forming a channel layer and gate, source and drain electrodes 34, 35 and 36.

The threshold value of the MESFET was measured and the result showed a threshold value Vth of −100 mV and a distribution σVth of about 5 mV.

For comparison, a MESFET having the same structure as shown in FIG. 7 was fabricated on the conventional GaAs/Si substrate produced with an off angle of 3 deg in Comparative Example 2. A measurement showed a threshold value Vth of −100 mV and a distribution σVth of about 10 mV.

It can be seen from the result that the semiconductor device fabricated on a compound semiconductor substrate according to the present invention had an improved electronic characteristic in comparison with the semiconductor device fabricated on a conventional compound semiconductor substrate.

As herein described above, the present invention provides a compound semiconductor substrate having at least one compound semiconductor layer epitaxially grown on a silicon single crystal substrate and having a surface smoothness sufficient to fabricate semiconductor devices having good electronic characteristics without the need for polishing with an interruption of the growth process.

The present invention also provides a semiconductor device fabricated on the compound semiconductor substrate according to the present invention and having an improved electronic characteristic in comparison with the semiconductor device fabricated on a conventional compound semiconductor substrate.

We claim:

1. A process of producing a compound semiconductor substrate having at least one compound semiconductor layer epitaxially grown on a silicon single crystal substrate, comprising the steps of:

preparing a silicon single crystal substrate having a surface inclined at an off angle of not more than 1 deg to a (100) plane of silicon crystal;

forming a buffer layer of a first compound semiconductor layer having a thickness of 5 nm to 15 nm on the surface of the silicon single crystal substrate; and epitaxially growing a second compound semiconductor layer on the buffer layer.

2. A process according to claim 1, wherein the off angle is not less than 0.1 deg.

3. A process according to claim 1, wherein the second compound semiconductor layer has a free or top surface having a roughness of 3 nm or less in terms of a mean square roughness, Rms, determined by an atomic force microscopic measurement in a view field area of 10 μm×10 μm.

4. A process according to claim 1, wherein the second compound semiconductor layer has a free or top surface having a roughness of 10.5 nm or less in terms of a maximum height difference, Ry.

5. A process according to claim 1, wherein the step of forming the buffer layer comprises forming an amorphous layer on the surface of the silicon single crystal substrate and crystallizing the amorphous layer to form the buffer layer.

6. A process according to claim 1, wherein the first compound semiconductor layer and the second compound semiconductor layer consist of a III–V compound or a II–VI compound.

7. A process according to claim 6, wherein the III–V compound is selected from the group consisting of GaAs, GaP, AlAs, AlP, InAs, InP, GaAsP, AlAsP, InAsP, AlGeAs, AlInAs, GaInAs, AlGaP, AlInP, and GaInP.

8. A process according to claim 6, wherein the II–VI compound is selected from the group consisting of ZnS, ZnSe, ZnTe, CdS, CdSe, CdTe, HgTe, CdZbS, SdZnSe, CdZnTe, ZnSSe, CdSSe, ZnSeTe, CdSeTe, and HgCdTe.

* * * * *